(12) United States Patent
Scott et al.

(10) Patent No.: US 11,043,921 B2
(45) Date of Patent: Jun. 22, 2021

(54) DOHERTY AMPLIFIER SYSTEM

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/516,774

(22) Filed: Jul. 19, 2019

(65) Prior Publication Data

US 2020/0028472 A1  Jan. 23, 2020

Related U.S. Application Data

(60) Provisional application No. 62/701,217, filed on Jul. 20, 2018.

(51) Int. Cl.
*H03F 3/68* (2006.01)
*H03F 1/02* (2006.01)
*H03F 3/19* (2006.01)
*H03F 3/20* (2006.01)
(Continued)

(52) U.S. Cl.
CPC ............. *H03F 1/0288* (2013.01); *H03F 3/19* (2013.01); *H03F 3/20* (2013.01); *H03F 3/211* (2013.01); *H03F 3/602* (2013.01)

(58) Field of Classification Search
CPC . H03F 1/0288; H03F 3/20; H03F 3/19; H03F 3/24; H03F 1/565; H03F 3/195; H03F 3/245; H03F 2200/451; H03F 3/602; H03F 3/211; H03F 3/607; H03F 3/60;
(Continued)

(56) References Cited

U.S. PATENT DOCUMENTS

| 6,356,149 B1 * | 3/2002 | Stengel | H03F 1/0288 |
| | | | 330/107 |
| 7,345,535 B2 * | 3/2008 | Kwon | H03F 1/0205 |
| | | | 330/124 R |
| 7,427,895 B1 | 9/2008 | Okubo et al. | |

(Continued)

OTHER PUBLICATIONS

Non-Final Office Action for U.S. Appl. No. 16/516,766, dated Dec. 7, 2020, 7 pages.

(Continued)

*Primary Examiner* — Khanh V Nguyen
(74) *Attorney, Agent, or Firm* — Withrow & Terranova, P.L.L.C.

(57) ABSTRACT

A Doherty amplifier system is disclosed. A main amplifier is configured to receive a first portion of a radio frequency (RF) signal at a main input and provide an amplified copy of the first portion of the RF signal at a main output. A peaking amplifier is configured to be controllably activated to receive a second portion of the RF signal at a peak input and provide an amplified copy of the second portion of the RF signal at a peak output. A saturation detector has a detector input coupled to the main output of the main amplifier and a first detector control output, wherein the saturation detector is configured to detect saturation of the main amplifier and activate the peaking amplifier as saturation of the main amplifier is detected and deactivate the peaking amplifier when saturation of the main amplifier is not detected by the saturation detector.

20 Claims, 15 Drawing Sheets

(51) Int. Cl.
*H03F 3/60* (2006.01)
*H03F 3/21* (2006.01)

(58) Field of Classification Search
CPC . H03F 3/604; H01L 23/66; H01L 2223/6655; H01L 2223/6611
USPC ........................................ 330/124 R, 286, 295
See application file for complete search history.

(56) References Cited

U.S. PATENT DOCUMENTS

| | | | | |
|---|---|---|---|---|
| 7,786,797 | B2* | 8/2010 | Okazaki | H03F 1/0288 |
| | | | | 330/124 R |
| 8,115,546 | B2 | 2/2012 | Hong et al. | |
| 8,279,009 | B2* | 10/2012 | Grondahl | H03F 1/0261 |
| | | | | 330/286 |
| 9,774,299 | B2 | 9/2017 | Staudinger et al. | |
| 9,979,352 | B2* | 5/2018 | Hur | H03F 3/213 |
| 2009/0206927 | A1 | 8/2009 | Okubo et al. | |
| 2010/0001802 | A1 | 1/2010 | Blednov | |
| 2014/0132343 | A1 | 5/2014 | Colantonio et al. | |
| 2015/0119107 | A1 | 4/2015 | Bouny | |
| 2015/0180428 | A1 | 6/2015 | Pham et al. | |
| 2015/0229276 | A1 | 8/2015 | Shiikuma | |
| 2021/0075374 | A1 | 3/2021 | Wang et al. | |

OTHER PUBLICATIONS

Notice of Allowance for U.S. Appl. No. 16/516,774, dated Apr. 14, 2021, 7 pages.

Non-Final Office Action for U.S. Appl. No. 16/710,461, dated Mar. 31, 2021, 8 pages.

Non-Final Office Action for U.S. Appl. No. 16/710,461, dated Apr. 27, 2021, 9 pages.

* cited by examiner

DOHERTY AMPLIFIER SYSTEM

RELATED APPLICATIONS

This application claims the benefit of provisional patent application Ser. No. 62/701,217, filed Jul. 20, 2018, the disclosure of which is hereby incorporated herein by reference in its entirety.

This application is related to U.S. patent application Ser. No. 16/516,766, filed Jul. 19, 2019, now U.S. Patent Application Publication No. 2020-0028471 A1, and titled DOHERTY POWER AMPLIFIER SYSTEM, which claims the benefit of provisional patent application Ser. No. 62/701,217, filed Jul. 20, 2018, the disclosures of which are hereby incorporated herein by reference in their entireties.

FIELD OF THE DISCLOSURE

The present disclosure relates to radio frequency amplifier systems and in particular to Doherty radio frequency amplifier systems with improved performance.

BACKGROUND

Radio frequency (RF) power amplifiers are used to increase the amplitude of RF signals for transmission. One popular type of RF power amplifier is the Doherty amplifier because of its relatively greater efficiency in comparison with many other RF power amplifier types. The Doherty amplifier includes a main amplifier and a peaking amplifier. Generally, at output power levels below an average output power level, only the main amplifier is active to amplify an RF signal. The peaking amplifier is typically configured to be active at an output power level close to around the average power level and then operates in parallel with the main amplifier to amplify an RF signal. However, due to environmental conditions such as large changes to voltage standing wave ratio, activation of the peaking amplifier may undesirably occur at output power levels well below the average output power or at output power levels well above the average output power. As such, an undesirable amount of distortion to the RF is generated. Accordingly, there is a need for an improved Doherty amplifier system that operates with reduced distortion.

SUMMARY

A Doherty amplifier system is disclosed. A main amplifier is configured to receive a first portion of a radio frequency (RF) signal at a main input and provide an amplified copy of the first portion of the RF signal at a main output. A peaking amplifier is configured to be controllably activated to receive a second portion of the RF signal at a peak input and provide an amplified copy of the second portion of the RF signal at a peak output. A saturation detector has a detector input coupled to the main output of the main amplifier and a first detector control output, wherein the saturation detector is configured to detect saturation of the main amplifier and to activate the peaking amplifier as saturation of the main amplifier is detected and to deactivate the peaking amplifier when saturation of the main amplifier is not detected by the saturation detector.

In an exemplary embodiment, the peaking amplifier is configured to be activated and deactivated through variable gain control. In this regard, the first detector control output of the saturation detector is coupled to a gain control input of the peaking amplifier.

In another exemplary embodiment, the Doherty amplifier system includes bias circuitry configured to activate and deactivate the peaking amplifier through variable bias control. In this regard, the first detector control output of the saturation detector is coupled to a bias control input of the bias circuitry.

In yet another exemplary embodiment, the Doherty amplifier system includes one or more driver amplifiers coupled between an RF signal input and the peak input of the peaking amplifier. At least one of the one or more driver amplifiers is configured to have variable gain with a variable gain control input coupled to the first detector control output of the saturation detector. In this exemplary embodiment, the peaking amplifier is configured to be activated and deactivated through variable gain control of the one or more driver amplifiers.

In still yet another exemplary embodiment, the Doherty amplifier system further includes a modulated power supply for powering at least the peaking amplifier. This particular exemplary embodiment is configured to tap a portion of a modulated power supply output signal to sum with a first detector control signal output from the saturation detector to refine activation and deactivation of the peaking amplifier.

Other exemplary embodiments are combinations of the previous exemplary embodiments. For example, one additional embodiment activates and deactivates the peaking amplifier through gain control of the peaking amplifier and through variable bias control of the bias circuitry. Other additional exemplary embodiments activate and deactivate the peaking amplifier through gain control of both the peaking amplifier and the one or more driver amplifiers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
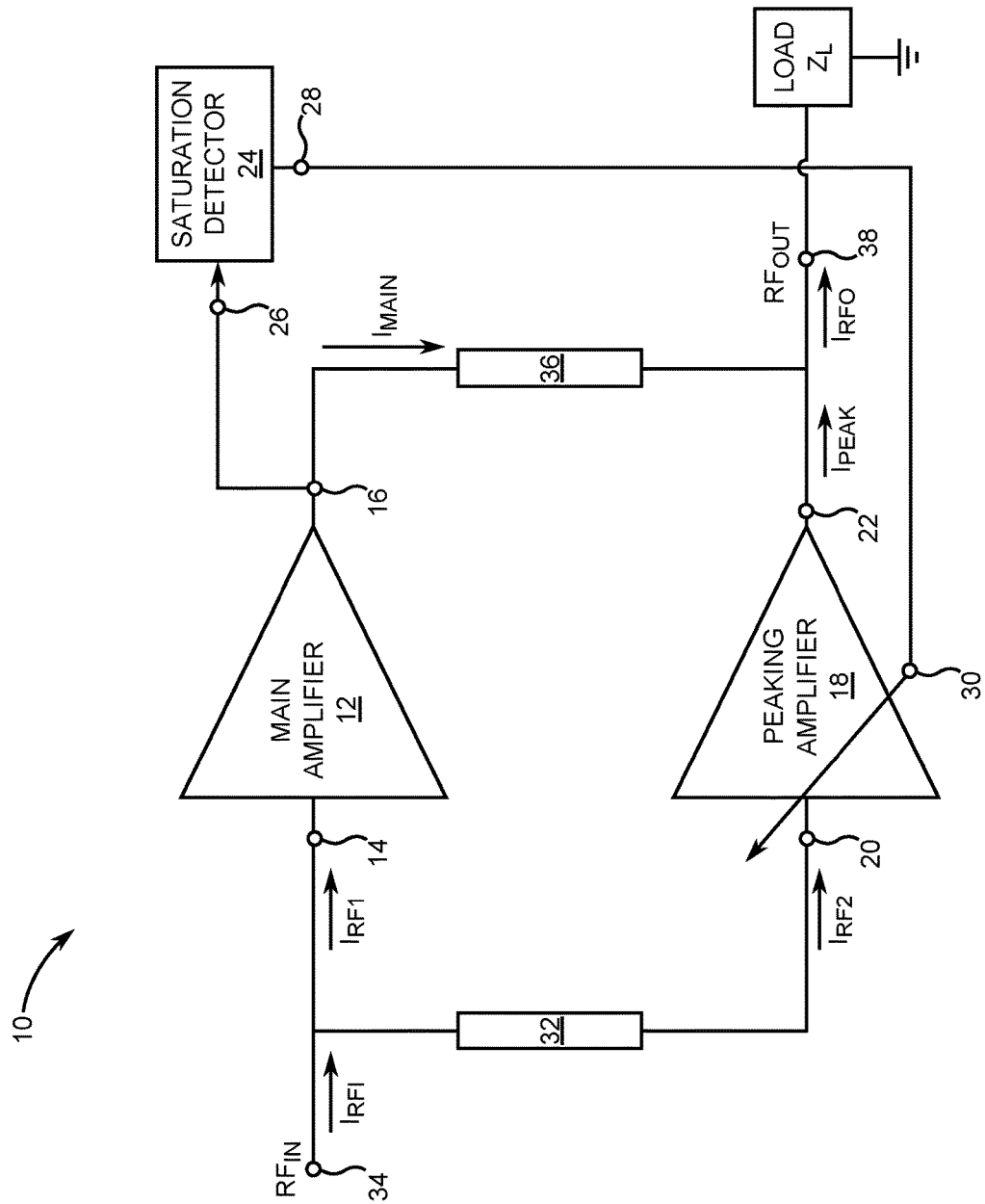
FIG. 1 is a simplified schematic of an exemplary embodiment of a Doherty amplifier system of the present disclosure that includes a saturation detector that is configured to activate a peaking amplifier as saturation of a main amplifier is detected.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a simplified schematic of an exemplary embodiment of a Doherty amplifier system 10 that is structured in accordance with the present disclosure. A main amplifier 12 is configured to receive a first portion $I_{RF1}$ of a radio frequency (RF) signal $I_{RFI}$ at a main input 14 and provide a main current $I_{MAIN}$ that is an amplified copy of the first portion $I_{RF1}$ of the RF signal $I_{RFI}$ at a main output 16. A peaking amplifier 18 is configured to be controllably activated to receive a second portion $I_{RF2}$ of the RF signal $I_{RFI}$ at a peak input 20 and provide a peak current $I_{PEAK}$ that is an amplified copy of the second portion $I_{RF2}$ of the RF signal $I_{RFI}$ at a peak output 22. A saturation detector 24 has a detector input 26 coupled to the main output 16 of the main amplifier 12 and a first detector control output 28, wherein the saturation detector 24 is configured to detect saturation of the main amplifier 12 and activate the peaking amplifier 18 as saturation of the main amplifier 12 is detected and deactivate the peaking amplifier 18 when saturation of the main amplifier 12 is not detected by the saturation detector 24.

In this particular exemplary embodiment, the first detector control output 28 is coupled to a first gain control input 30 of the peaking amplifier 18. In operation, the saturation detector 24 generates a first control signal with a current and/or voltage level that activates the peaking amplifier 18 by increasing gain as the saturation detector 24 detects saturation of the main amplifier 12. When the saturation detector 24 does not detect saturation of the main amplifier 12, the saturation detector 24 generates the first control signal with a current and/or voltage level that deactivates the peaking amplifier 18 by reducing gain of the peaking amplifier 18.

The Doherty amplifier system 10 further includes an input coupler 32 coupled between an RF signal input 34 and the peak input 20. The RF signal input 34 is also coupled to the main input 14. The input coupler 32 provides the second portion $I_{RF2}$ of the RF signal $I_{RFI}$ to the peaking amplifier 18 through the peak input 20. The input coupler 32 typically provides a phase shift of 90°±5° to the second portion $I_{RF2}$ of the RF signal $I_{RFI}$. In exemplary embodiments, the input coupler 32 may be a quadrature coupler such as a branchline coupler or a Lange coupler.

The Doherty amplifier system 10 also further includes an output coupler 36 coupled between the main output 16 and an RF signal output 38. The output coupler 36 provides a phase shift to the main current $I_{MAIN}$ needed to properly combine the main current $I_{MAIN}$ with the peak current $I_{PEAK}$ to form an output current $I_{RFO}$ that flows from the RF signal output 38 into a load $Z_L$. A typical phase shift applied to the main current $I_{MAIN}$ is 90°±5°. In exemplary embodiments, the output coupler 36 may be a quadrature coupler such as a branchline coupler or a Lange coupler.

Figure 2:
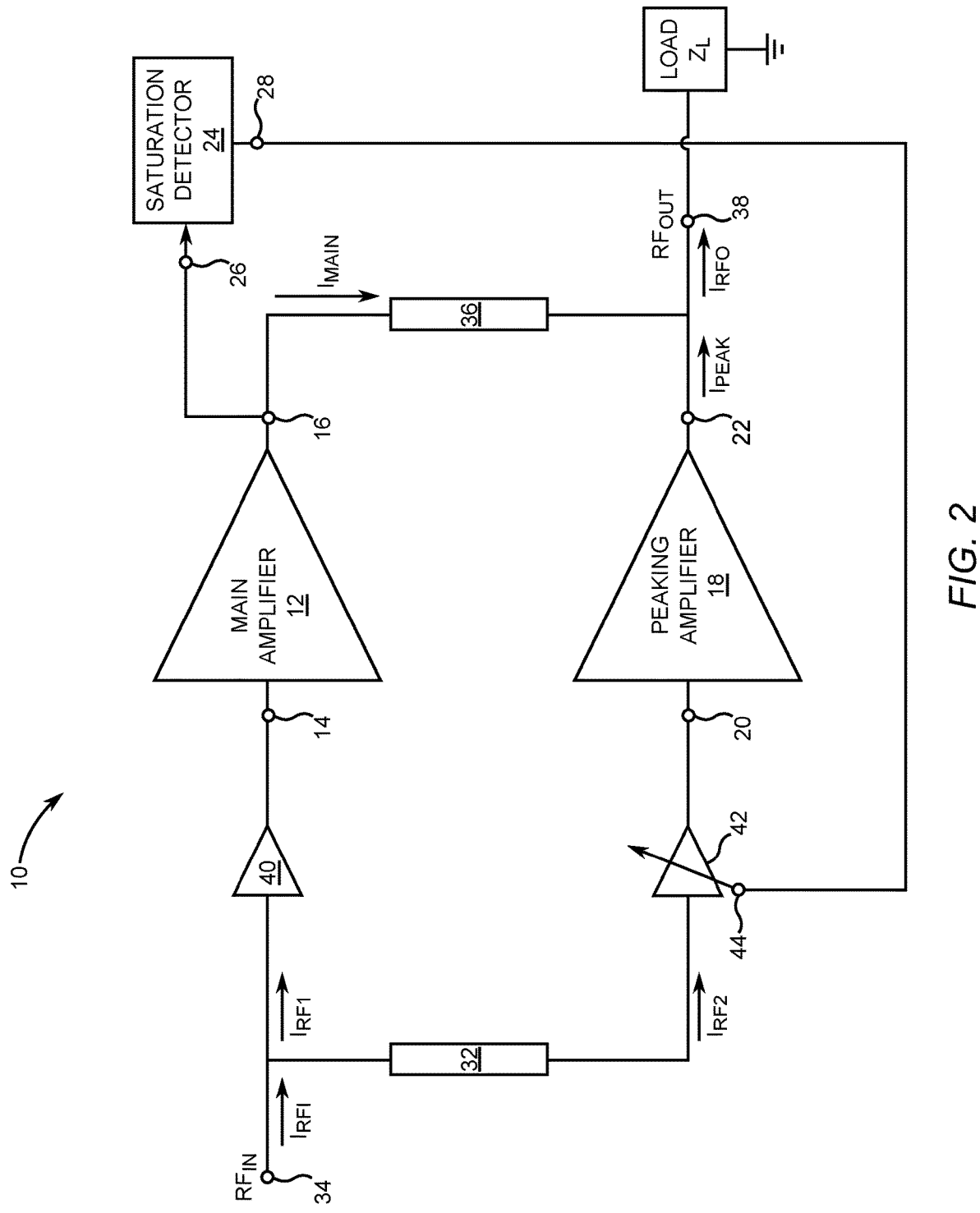
FIG. 2 is a simplified schematic of an exemplary embodiment of the Doherty amplifier system further including a peaking driver amplifier that is configured to be controlled by the saturation detector and a main driver amplifier.

FIG. 2 is a simplified schematic of an exemplary embodiment of the Doherty amplifier system 10 further including a main driver amplifier 40 and a peaking driver amplifier 42. The main driver amplifier 40 is coupled between the RF signal input 34 and the main input 14, and the peaking driver amplifier 42 is coupled between the RF signal input 34 and the peak input 20. The peaking driver amplifier 42 is configured to have controllable gain and includes a second gain control input 44 that is coupled to the first detector control output 28.

In operation of the exemplary embodiment of FIG. 2, the saturation detector 24 generates the first control signal with a current and/or voltage level that activates the peaking amplifier 18 by increasing gain of the peaking driver amplifier 42 as the saturation detector 24 detects saturation of the main amplifier 12. When the saturation detector 24 does not detect saturation of the main amplifier 12, the saturation detector 24 generates the first control signal with a current and/or voltage level that deactivates the peaking amplifier 18 by reducing gain of the peaking driver amplifier 42.

Figure 3:
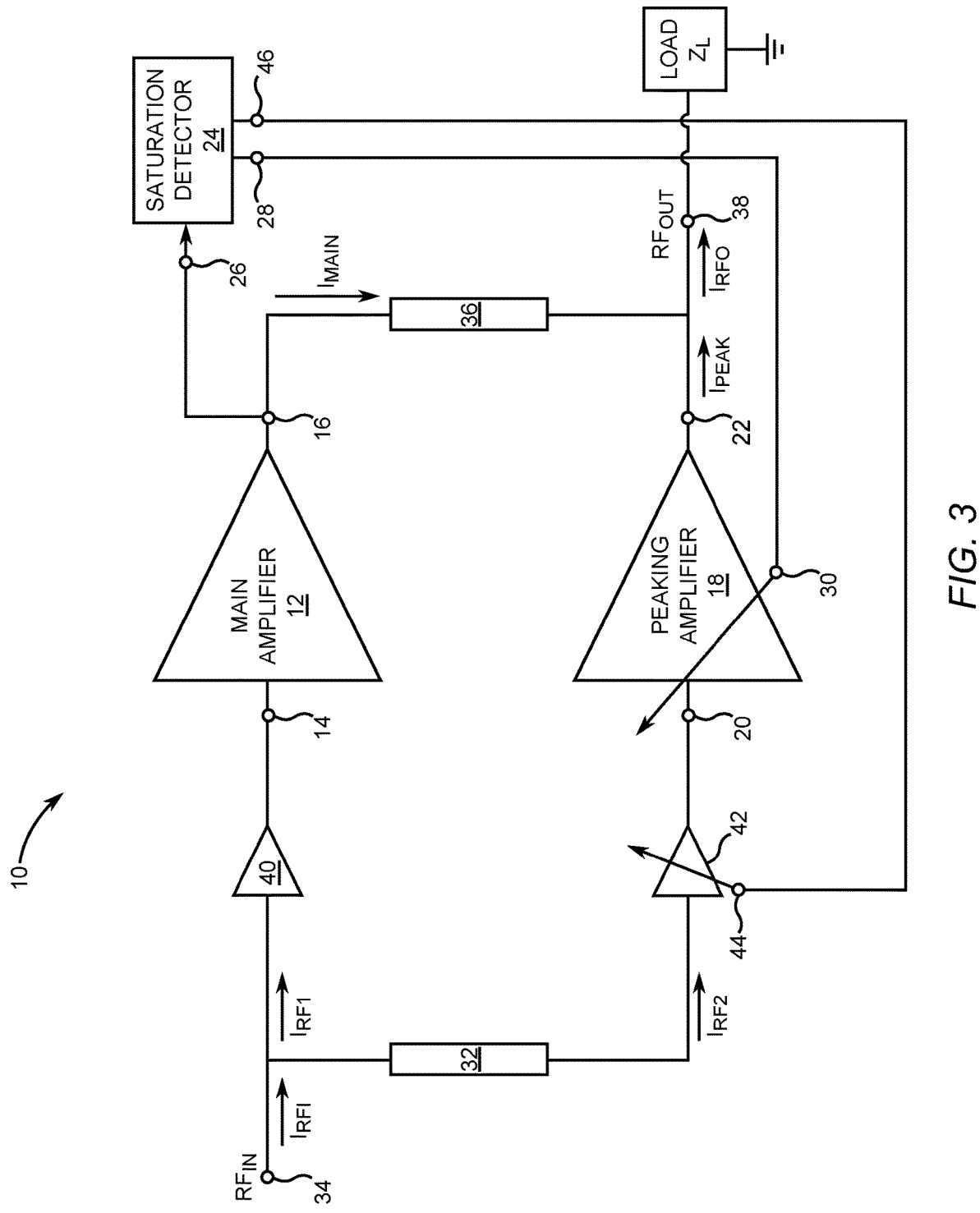
FIG. 3 is a simplified schematic of an exemplary embodiment of the Doherty amplifier system, wherein the saturation detector is further configured to control activation of the peaking amplifier by controlling gain of both the peaking amplifier and the peaking driver amplifier.

FIG. 3 is a simplified schematic of an exemplary embodiment of the Doherty amplifier system 10, wherein the saturation detector 24 is further configured to control activation of the peaking amplifier 18 by controlling gain of both the peaking amplifier 18 and the peaking driver amplifier 42. The first detector control output 28 is coupled to the first gain control input 30 of the peaking amplifier 18 and a second detector control output 46 of the saturation detector 24 is coupled to the second gain control input 44 of the peaking driver amplifier 42.

In operation of the exemplary embodiment of FIG. 3, the saturation detector 24 generates the first control signal with a current and/or voltage level that activates the peaking amplifier 18 by increasing gain of the peaking amplifier 18 as the saturation detector 24 detects saturation of the main amplifier 12. The saturation detector 24 also generates a second control signal with a current and/or voltage level that activates the peaking amplifier 18 by increasing gain of the peaking driver amplifier 42.

When the saturation detector 24 does not detect saturation of the main amplifier 12, the saturation detector 24 generates the first control signal with a current and/or voltage level that deactivates the peaking amplifier 18 by reducing gain of the peaking amplifier 18. Moreover, when the saturation detector 24 does not detect saturation of the main amplifier 12, the saturation detector 24 generates the second control signal with a current and/or voltage level that deactivates the peaking amplifier 18 by reducing gain of the peaking driver amplifier 42.

Figure 4:
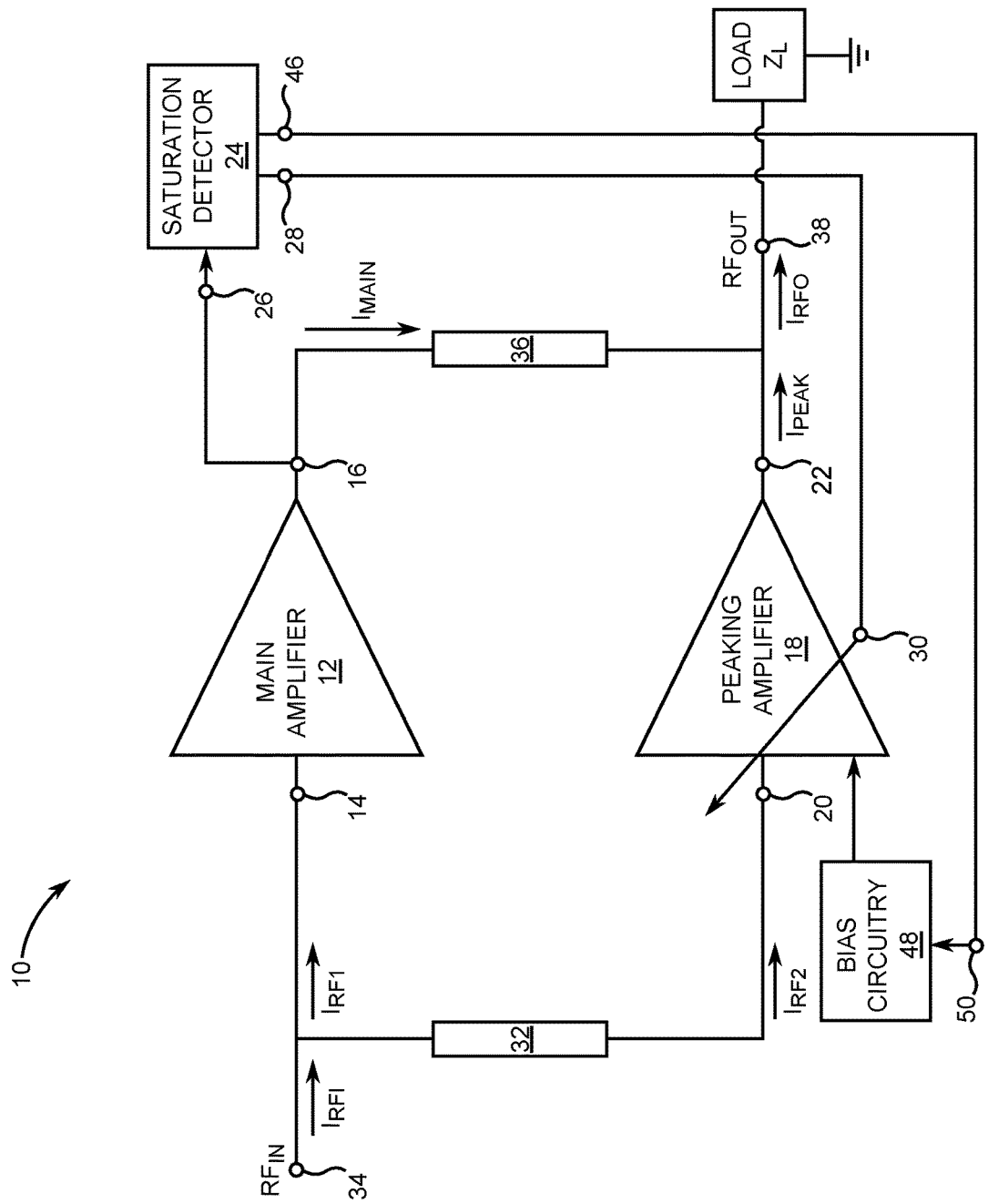
FIG. 4 is a simplified schematic of an exemplary embodiment of the Doherty amplifier system that further includes bias circuitry that is configured to adjust a bias point of the peaking amplifier under control of the saturation detector to activate and deactivate the peaking amplifier.

FIG. 4 is a simplified schematic of an exemplary embodiment of the Doherty amplifier system 10 that further includes bias circuitry 48. The bias circuitry 48 is configured to adjust a bias point of the peaking amplifier 18 under control of the saturation detector 24 to activate the peaking amplifier 18 as the main amplifier 12 becomes saturated and deactivate the peaking amplifier 18 when the saturation detector 24 detects that the main amplifier 12 is operating in a non-saturated state. In the exemplary embodiment of FIG. 4, the bias circuitry 48 has a bias control input 50 that is coupled to the second detector control output 46 of the saturation detector 24.

In operation of the exemplary embodiment of FIG. 4, the saturation detector 24 generates the first control signal with a current and/or voltage level that activates the peaking amplifier 18 by increasing gain of the peaking amplifier 18 as the saturation detector 24 detects saturation of the main amplifier 12. The saturation detector 24 also generates the second control signal with a current and/or voltage level that activates the peaking amplifier 18 by increasing the bias point of the peaking amplifier 18.

When the saturation detector 24 does not detect saturation of the main amplifier 12, the saturation detector 24 generates the first control signal with a current and/or voltage level that deactivates the peaking amplifier 18 by reducing gain of the peaking amplifier 18. Also, when the saturation detector 24 does not detect saturation of the main amplifier 12, the saturation detector 24 generates the second control signal with a current and/or voltage level that deactivates the peaking amplifier 18 by reducing the bias point of the peaking amplifier 18. Although the exemplary embodiment of FIG. 4 discloses a combined operation of activation of the peaking amplifier 18 by controlling both gain and bias point, another disclosed mode of operation can activate and deactivate the peaking amplifier 18 by controlling the bias point alone. As such, the saturation detector 24 may activate and deactivate the peaking amplifier 18 through the second detector control output 46 alone in the exemplary embodiment of FIG. 4.

Figure 5:
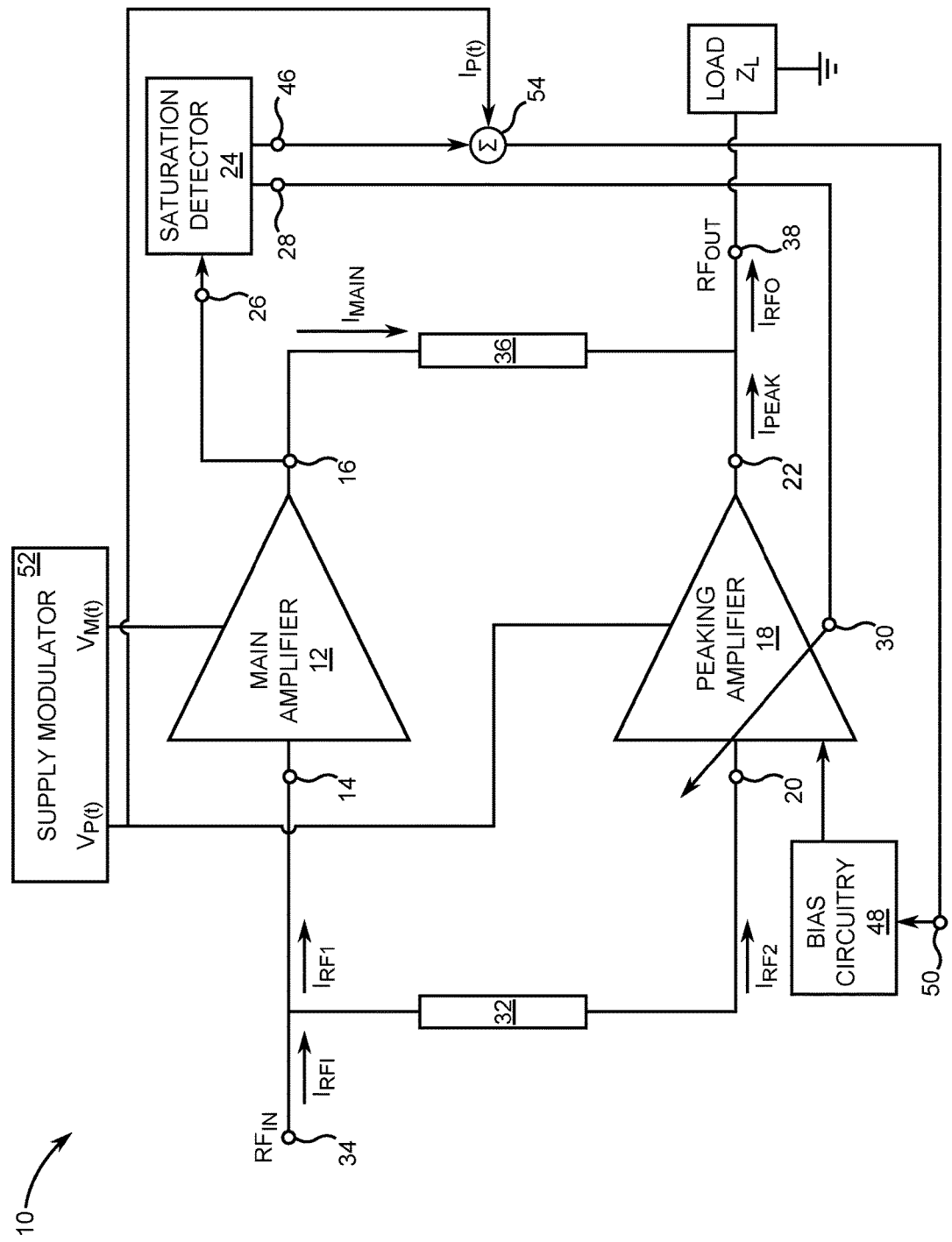
FIG. 5 is a schematic of an exemplary embodiment in which the Doherty amplifier system further includes a supply modulator that provides modulated power to the main amplifier and the peaking amplifier.

FIG. 5 depicts an exemplary embodiment in which the Doherty amplifier system 10 further includes a supply modulator 52 that provides modulated power to the main amplifier 12 and the peaking amplifier 18. In this exemplary embodiment, the supply modulator 52 is configured to modulate power in an envelope tracking mode and/or an average power tracking mode. In particular, the supply modulator 52 powers the main amplifier 12 with a modulated main supply voltage $V_{M(t)}$ and powers the peaking amplifier 18 with a modulated peak supply voltage $V_{P(t)}$. In some embodiments, the modulated main supply voltage $V_{M(t)}$ and the modulated peak supply voltage $V_{P(t)}$ are one in the same. In other embodiments, the modulated main supply voltage $V_{M(t)}$ and the modulated peak supply voltage $V_{P(t)}$ are separate and may be unequal in amplitude.

In the exemplary embodiment of FIG. 5, a supply variation control signal $I_{P(t)}$ is tapped from the modulated peak supply voltage $V_{P(t)}$ and summed with the second control signal at a summation node 54. A combining of the supply variation control signal $I_{P(t)}$ and the second control signal provides a refinement to the adjustment of the bias point of the peaking amplifier 18. As such, the activation and deactivation of the peaking amplifier 18 is refined for operation with modulated power.

The summation node 54 is shown external to both the saturation detector 24 and the bias circuitry 48. However, it is to be understood that the summation node 54 can physically be integrated with either the saturation detector 24 or the bias circuitry 48. Moreover in other exemplary embodiments, the supply variation control signal $I_{P(t)}$ may be summed with the first control signal to refine activation and deactivation of the peaking amplifier 18.

In operation of the exemplary embodiment of FIG. 5, the saturation detector 24 generates the first control signal with a current and/or voltage level that activates the peaking amplifier 18 by increasing gain of the peaking amplifier 18 as the saturation detector 24 detects saturation of the main amplifier 12. The saturation detector 24 also generates a second control signal with a current and/or voltage level that combined with the supply variation control signal $I_{P(t)}$ activates the peaking amplifier 18 by increasing the bias point of the peaking amplifier 18.

When the saturation detector 24 does not detect saturation of the main amplifier 12, the saturation detector 24 generates the first control signal with a current and/or voltage level that deactivates the peaking amplifier 18 by reducing gain of the peaking amplifier 18. Also, when the saturation detector 24 does not detect saturation of the main amplifier 12, the saturation detector 24 generates the second control signal with a current and/or voltage level that with the supply variation control signal $I_{P(t)}$ deactivates the peaking amplifier 18 by reducing the bias point of the peaking amplifier 18.

Figure 6:
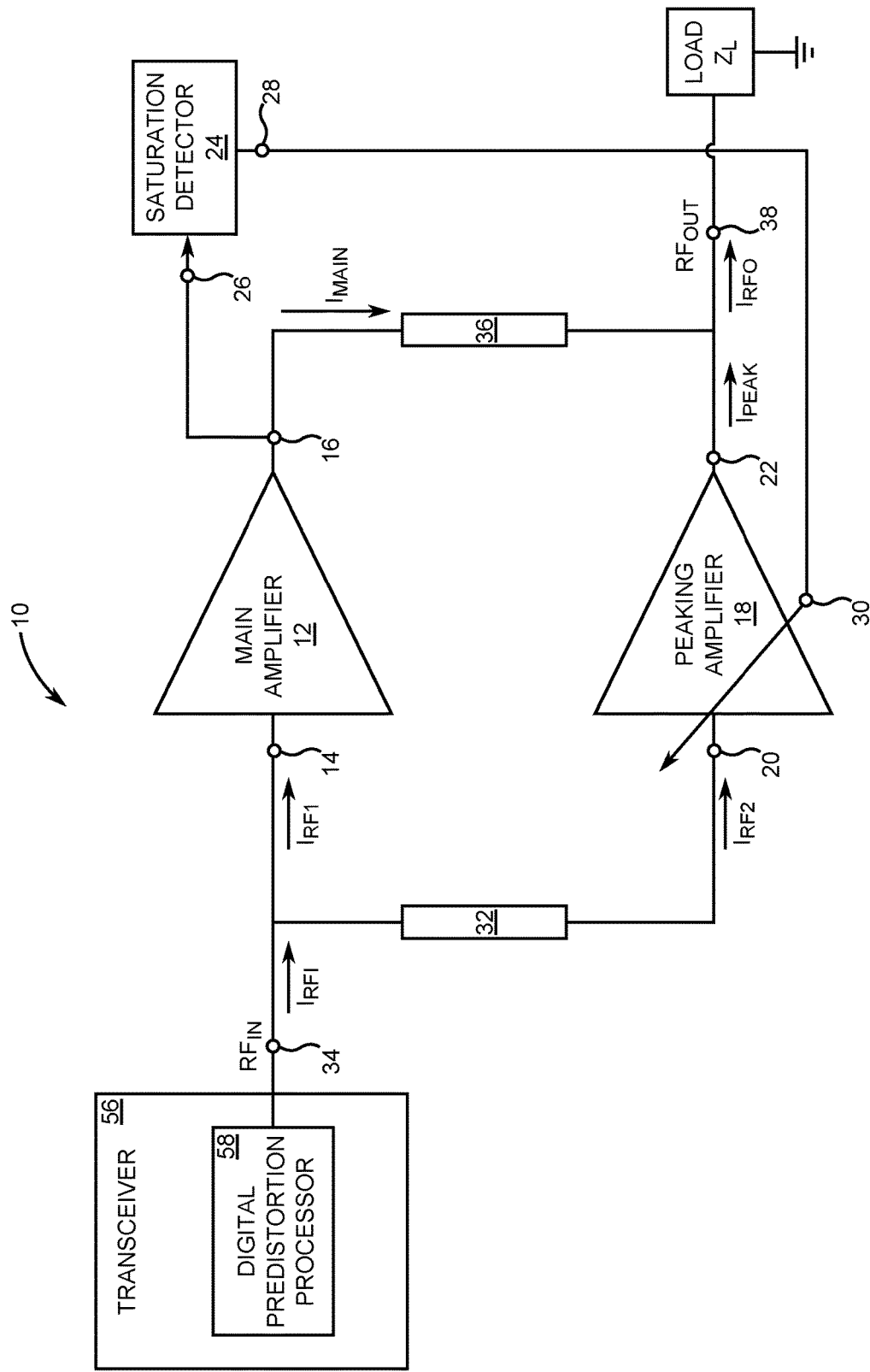
FIG. 6 is a schematic of an exemplary embodiment of the Doherty amplifier system wherein the main amplifier and the peaking amplifier are further configured to amplify a pre-distorted radio frequency (RF) signal generated by a transceiver and a digital predistortion processor.

FIG. 6 is a schematic of an exemplary embodiment of the Doherty amplifier system 10 wherein the main amplifier 12 and the peaking amplifier 18 are further configured to amplify a predistorted RF signal generated by a transceiver 56 and a digital predistortion processor 58. In this exemplary embodiment, the transceiver 56 generates an RF signal to be amplified that the digital predistortion processor 58 modifies using a predistortion linearization process that yields the RF signal $I_{RFI}$ that in this embodiment includes predistortion. In at least one embodiment, the predistortion linearization process compensates for non-linear behavior of the main amplifier 12 and the peaking amplifier 18 by modifying the amplitude and phase of the RF signal to be amplified. There are various predistortion linearization processes know in the art that are usable with the present disclosure.

Figure 7:
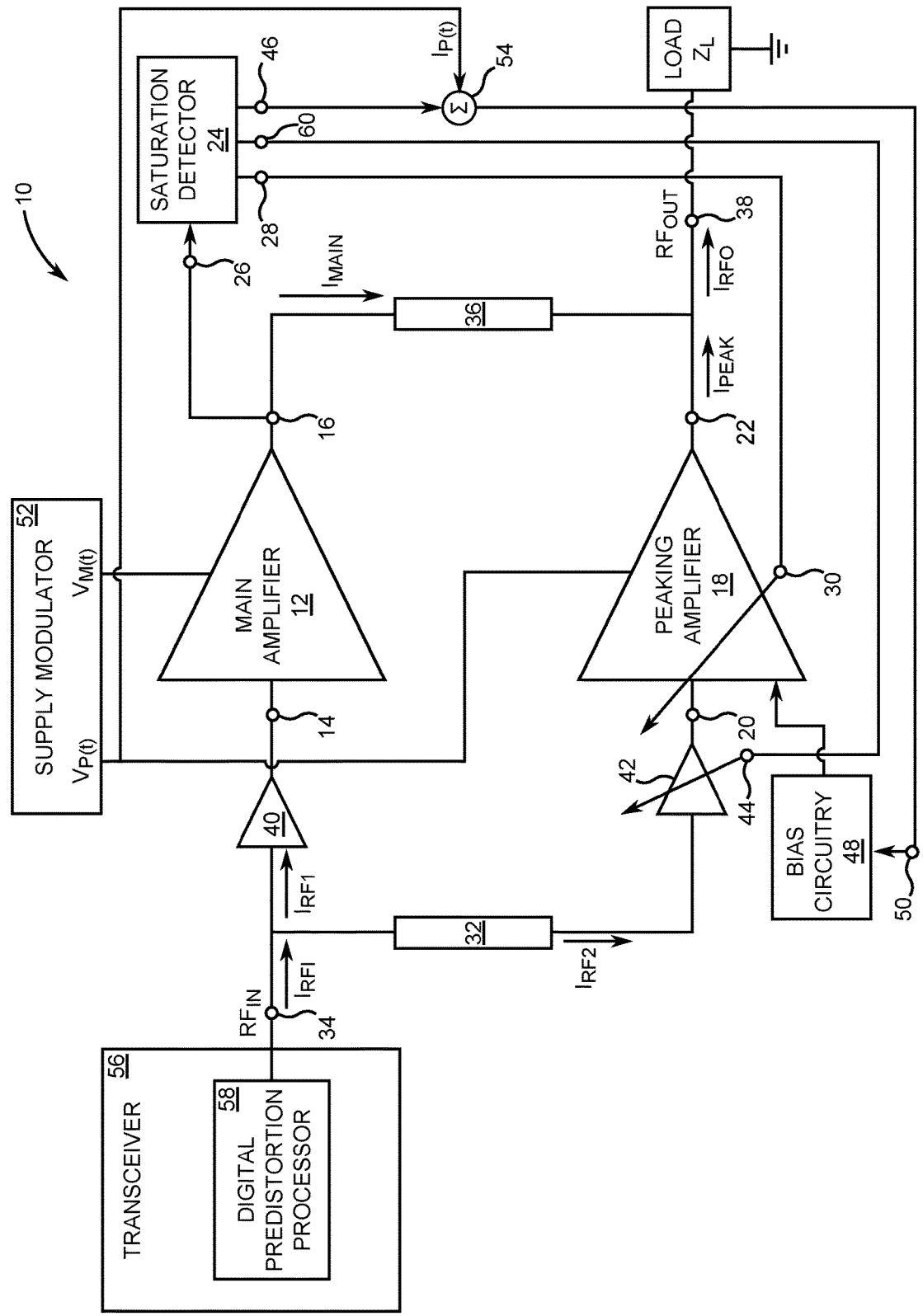
FIG. 7 is a schematic of an exemplary embodiment of the Doherty amplifier system that adds a third detector control output to the saturation detector so that all the of previously disclosed exemplary embodiments are realized in one embodiment.

FIG. 7 is a schematic of an exemplary embodiment of the Doherty amplifier system 10 that adds a third detector control output 60 to the saturation detector 24 so that all the of previously disclosed exemplary embodiments are realized in one embodiment. In this case, the first detector control output 28 is coupled to the first gain control input 30 of the peaking amplifier 18, the second detector control output 46 is coupled to the bias control input 50 of the bias circuitry 48, and the third detector control output 60 is coupled to the second gain control input 44 of the peaking driver amplifier 42.

Figure 8B:
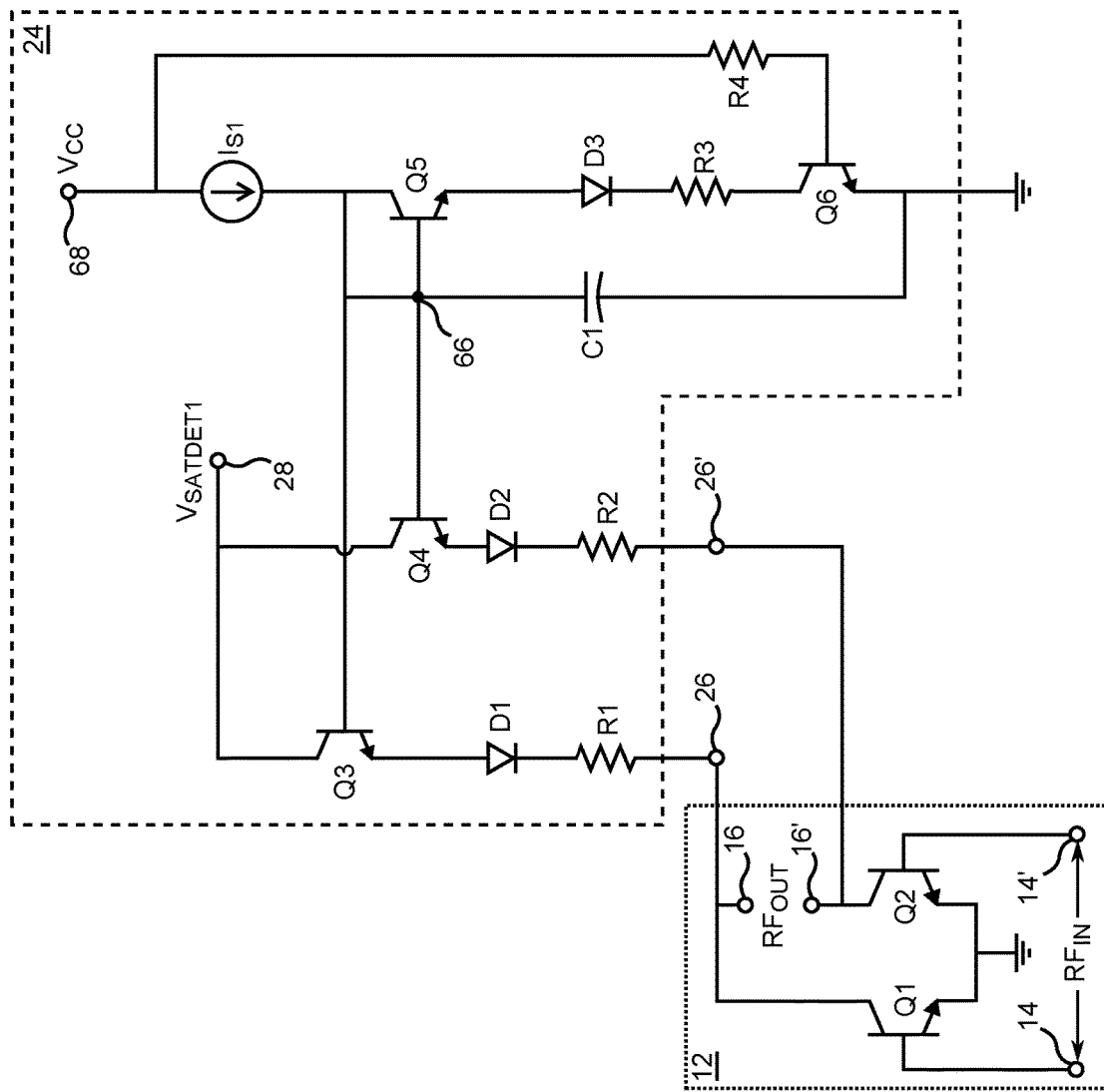
FIG. 8B is a schematic of an exemplary embodiment of the saturation detector.
Figure 8A:
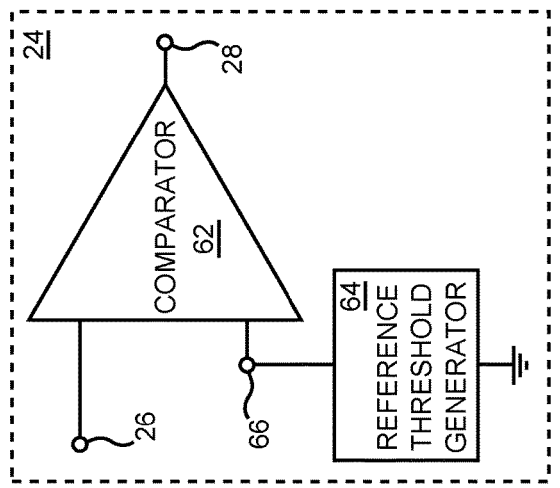
FIG. 8A is a generalized diagram of the saturation detector.

FIG. 8A is a generalized diagram of the saturation detector 24. In general, the saturation detector 24 is made up of a comparator 62 having the detector input 26, which is typically coupled to the main output 16 of the main amplifier 12. During operation, at least one control output signal of the comparator 62 is passed through at least the first detector control output 28 to activate and deactivate the peaking amplifier 18 (FIGS. 1-7). A reference threshold generator 64 is coupled to a reference input 66 of the comparator 62. During operation, a magnitude of the control output signal of the comparator 62 is determined by an amplified difference between a reference threshold signal generated by the reference threshold generator 64 and a signal level at the detector input 26. The peaking amplifier 18 activates once the magnitude of the control output signal is above a predetermined activation set point, and the peaking amplifier 18 deactivates if the magnitude of the control signal is below the predetermined activation set point. Some hysteresis may be desirable in some applications.

FIG. 8B is a schematic of an exemplary embodiment of the saturation detector 24. In FIG. 8B, the main amplifier 12 is shown as a differential RF power amplifier made up of a first transistor Q1 and a second transistor Q2. In this exemplary embodiment, the first transistor Q1 and the second transistor Q2 are bipolar junction transistors. However, it is to be understood that the first transistor Q1 and the second transistor Q2 are not limited to any type of transistor technology and may be other types of transistors, for example, metal oxide semiconductor and high electron mobility transistor types. Moreover, the main amplifier 12 need not be a differential-type amplifier and may instead be a single-ended RF power amplifier that does not include the second transistor Q2.

In this exemplary embodiment, a base of the first transistor Q1 is coupled to the main input 14 and a base of the second transistor Q2 is coupled to a differential input 14'. Emitters of both the first transistor Q1 and the second transistor Q2 are coupled to a fixed voltage node, which in this case is ground. A collector of the first transistor Q1 is coupled to the main output 16 and a collector of the second transistor Q2 is coupled to a differential output 16', which in turn is coupled to a differential detector input 26' of the saturation detector 24.

In this exemplary embodiment, a third transistor Q3 is coupled between the first detector control output 28 and the detector input 26. In this particular case, the third transistor Q3 has a collector coupled to the first detector control output 28 and an emitter coupled to detector input 26 through a first diode D1 and a first resistor R1. Electrical characteristics of the first diode D1 and the first resistor R1 are predetermined to provide a first portion of a first desired output $V_{SATDET1}$ at the first detector control output 28.

A fourth transistor Q4 has a collector coupled to the first detector control output 28 and an emitter coupled to the differential detector input 26' through a second diode D2 and a second resistor R2. Electrical characteristics of the second diode D2 and the second resistor R2 are predetermined to provide a second portion of the first desired output $V_{SATDET1}$ at the first detector control output 28.

An exemplary embodiment of the reference threshold generator 64 depicted in FIG. 8A is depicted in FIG. 8B as including a first current source $I_{S1}$ coupled between a voltage supply input 68 ($V_{CC}$) and a collector of a fifth transistor Q5 that has an emitter coupled to an anode of a third diode D3. A third resistor R3 is coupled between a cathode of the third diode and a collector of a sixth transistor Q6, which has an emitter coupled to the fixed voltage node that is ground in this exemplary case. The collector of the fifth transistor Q5 is coupled to the reference input 66, which is coupled to bases of the third transistor Q3, the fourth transistor Q4, and the fifth transistor Q5. A filter capacitor C1 is coupled between the reference input 66 and the fixed voltage node that in this exemplary embodiment is ground. A fourth resistor R4 is coupled between the voltage supply input 68 and a base of the sixth transistor Q6. Electrical characteristics of the first current source $I_{S1}$, the third diode, the third resistor R3, and the fourth resistor R4 are predetermined to provide a reference threshold voltage at the reference input 66.

Figure 9:
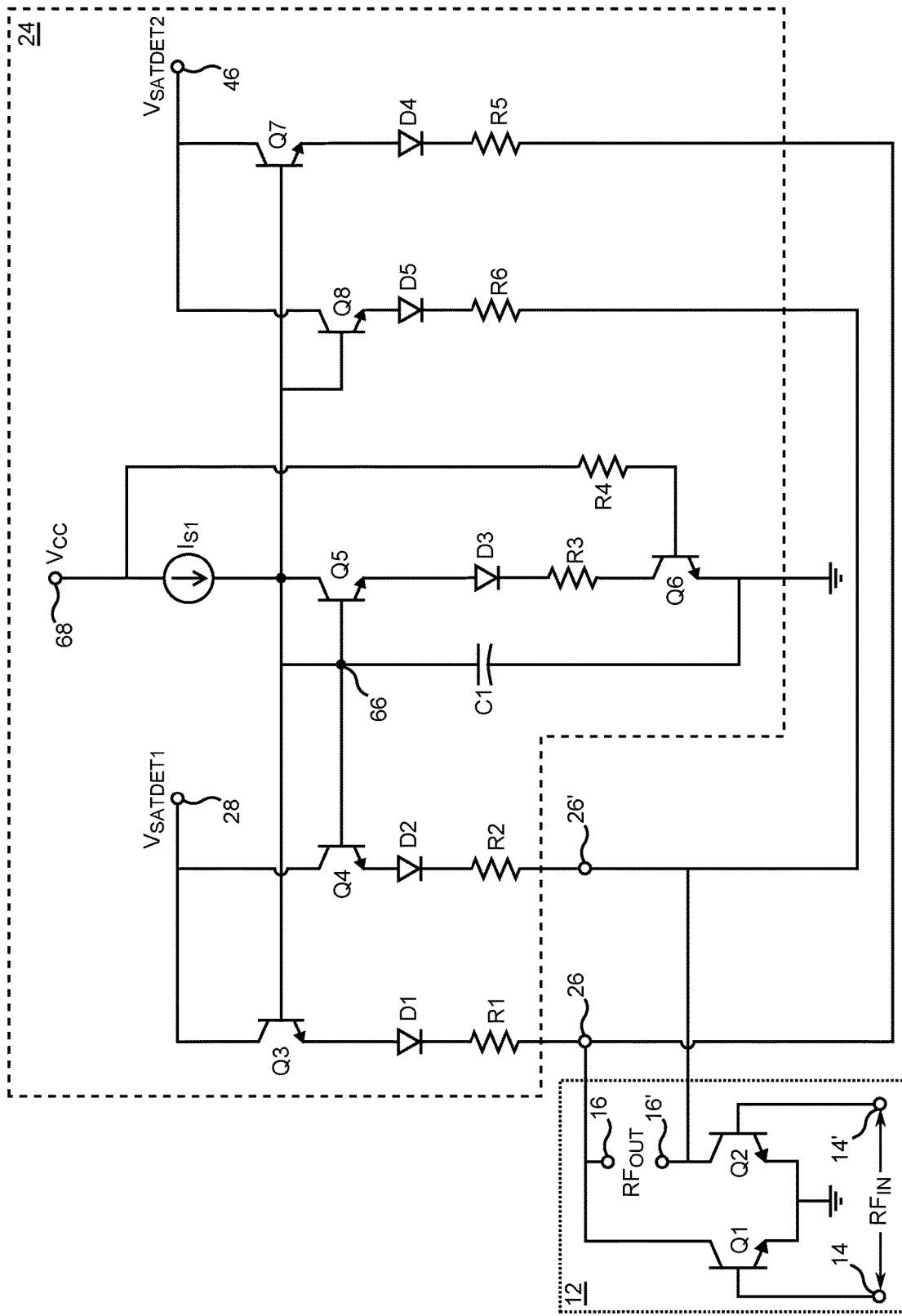
FIG. 9 is a schematic of an exemplary embodiment of the saturation detector that includes more than one detector control output.

FIG. 9 is a schematic of an exemplary embodiment of the saturation detector 24 that has more than one detector control output, and in this particular case includes the second detector control output 46. In this exemplary embodiment, a collector of a seventh transistor Q7 is coupled to the second detector control output 46 and an emitter of the seventh transistor Q7 is coupled to an anode of a fourth diode D4. A fifth resistor R5 is coupled between a cathode of the fourth diode D4 and the detector input 26. A base of the seventh transistor Q7 is coupled to the reference input 66. Electrical characteristics of the fourth diode D4 and the fifth resistor R5 are predetermined to provide a first portion of a second desired output $V_{SATDET2}$ at the second detector control output 46.

Further in this exemplary embodiment, a collector of an eighth transistor Q8 is coupled to the second detector control output 46 and an emitter of the eighth transistor Q8 is coupled to an anode of a fifth diode D5. A sixth resistor R6 is coupled between a cathode of the fifth diode D5 and the differential detector input 26'. A base of the eighth transistor Q8 is coupled to the reference input 66. Electrical characteristics of the fifth diode D5 and the sixth resistor R6 are predetermined to provide a second portion of a second desired output $V_{SATDET2}$ at the second detector control output 46.

Figure 10:
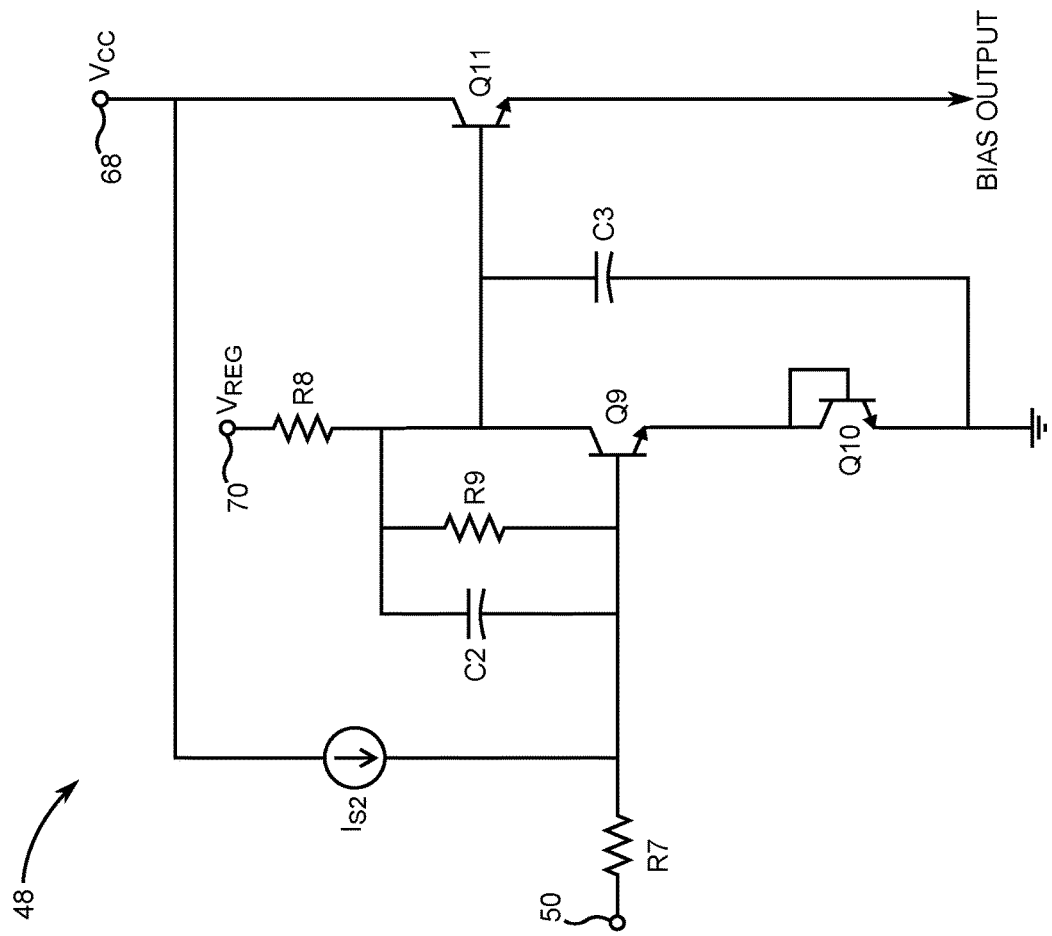
FIG. 10 is a schematic of an exemplary embodiment of bias circuitry.

FIG. 10 is a schematic of an exemplary embodiment of bias circuitry 48 (FIGS. 4, 5, and 7). The bias circuitry 48 of FIG. 10 includes a ninth transistor Q9 having a base coupled to the bias control input 50 through a seventh resistor R7 and a collector coupled to a voltage regulator input 70 ($V_{REG}$) through an eighth resistor R8. A ninth resistor R9 couples the collector and the base of the ninth transistor together. A second capacitor C2 coupled in parallel with the ninth resistor R9 provides a loop dominant pole, and a second current source $I_{S2}$ is coupled between the voltage regulator input 70 and the base of the ninth transistor Q9 to provide bias to the ninth transistor Q9. A tenth transistor Q10 is in a diode-connected configuration with a base and collector coupled to a emitter of the ninth transistor Q9. An emitter of the tenth transistor Q10 is coupled to the fixed voltage node, which is ground in this particular case. An eleventh transistor Q11 has a collector coupled to the voltage supply input 68 and a base that is coupled to the fixed voltage node through a third capacitor C3. An emitter of the eleventh transistor provides a bias output for the peaking amplifier 18 as shown in FIGS. 4, 5, and 7.

Figure 11:
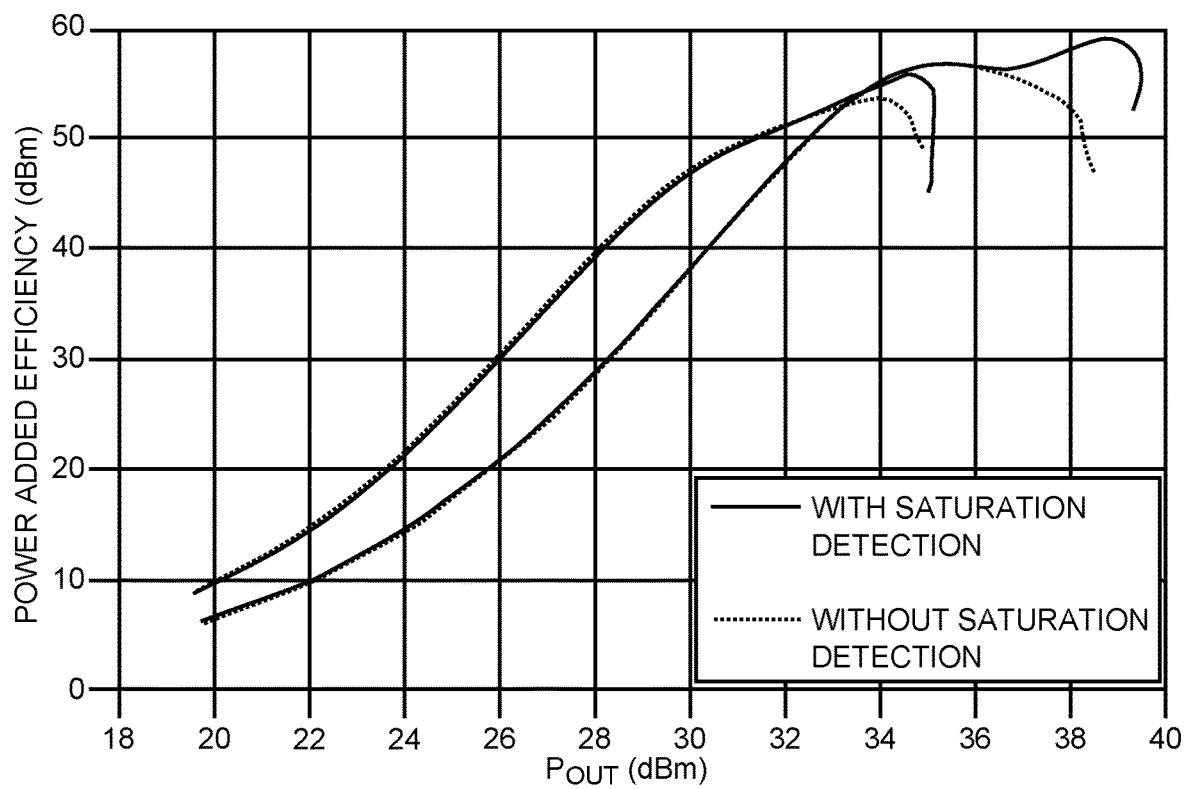
FIG. 11 is an exemplary graph of power added efficiency versus output power for a lower supply voltage $V_{CC}$ and a higher supply voltage $V_{CC}$ with activation of the peaking amplifier under control of the saturation detector and without control of the saturation detector.

FIG. 11 is an exemplary graph of power added efficiency versus output power for a lower supply voltage $V_{CC}$ and a higher supply voltage $V_{CC}$ with activation of the peaking amplifier 18 under control of the saturation detector 24 and without control of the saturation detector 24. Notice that the power added efficiency of the Doherty amplifier system 10 extends over a wider output power range while activation of the peaking amplifier 18 is under control of the saturation detector 24 versus no control of the activation of the peaking amplifier 18.

Figure 12:
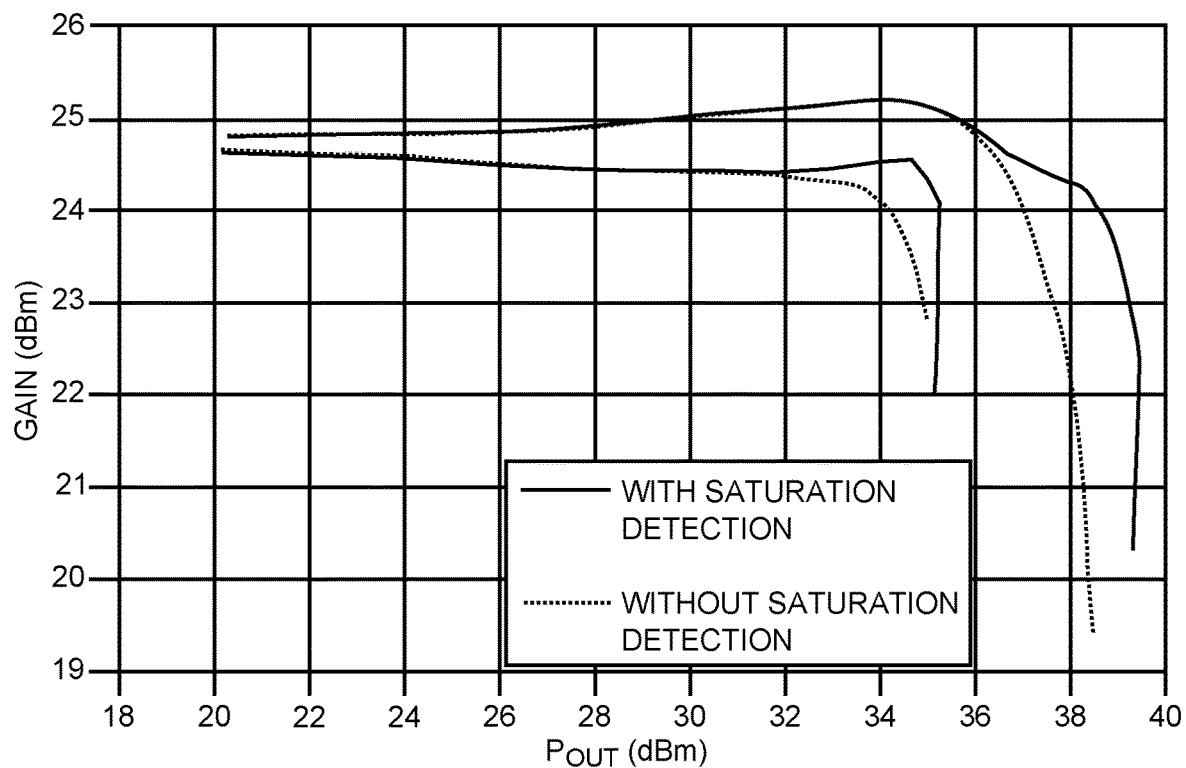
FIG. 12 is an exemplary graph of gain versus output power for a lower supply voltage $V_{CC}$ and a higher supply voltage $V_{CC}$ with activation of the peaking amplifier under control of the saturation detector and without control of the saturation detector.

FIG. 12 is an exemplary graph of gain versus output power for a lower supply voltage $V_{CC}$ and a higher supply voltage $V_{CC}$ with activation of the peaking amplifier 18 under control of the saturation detector 24 and without control of the saturation detector 24. Notice that the gain of the Doherty amplifier system 10 extends over a wider output power range while activation of the peaking amplifier 18 is under control of the saturation detector 24 versus no control of the activation of the peaking amplifier 18.

Figure 13:
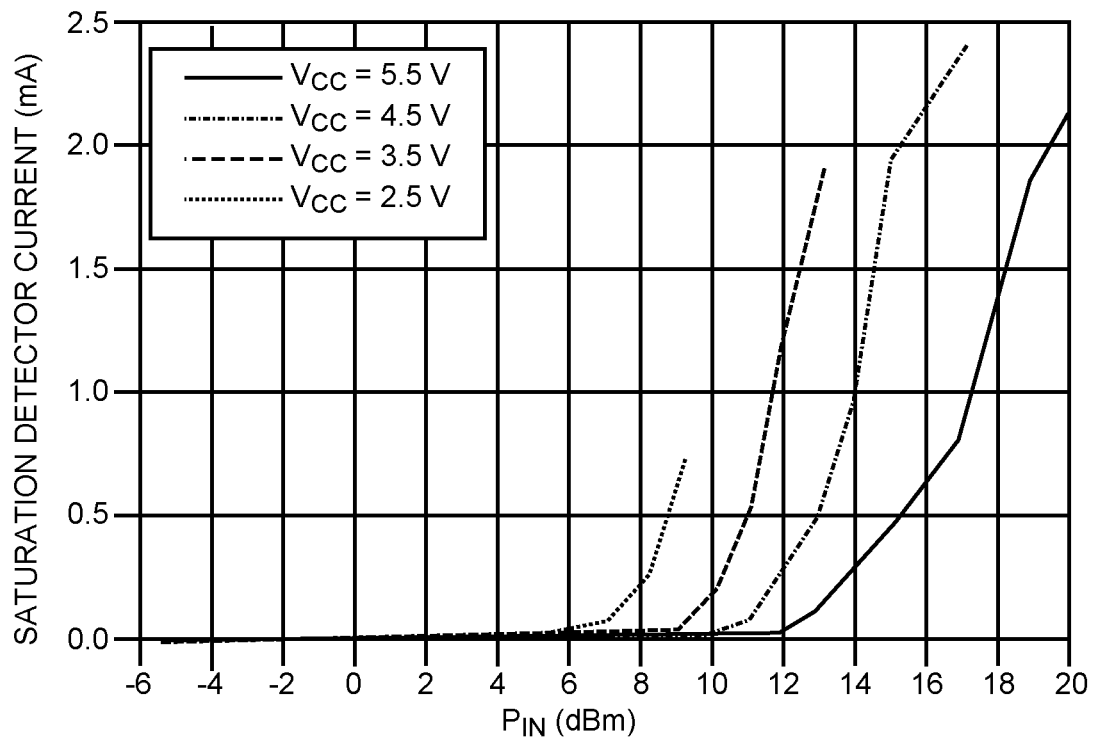
FIG. 13 is an exemplary graph of saturation detector current associated with various supply voltages versus input power.

FIG. 13 is an exemplary graph of saturation detector current associated with various supply voltages versus input power. In particular, the exemplary graph of FIG. 13 depicts a direct current average current provide by the saturation detector 24 through the first detector control output 28 under various supply voltages. Notice that when the supply voltage $V_{CC}$ is relatively low, such as 2.5 V, the main amplifier 12 goes into an "earlier" saturation at lower input power level of 6 dBm in comparison with a "later" saturation of the main amplifier 12 for a higher supply voltage $V_{CC}$ of 5.5 V at a higher input power level of 12 dBm.

Figure 14:
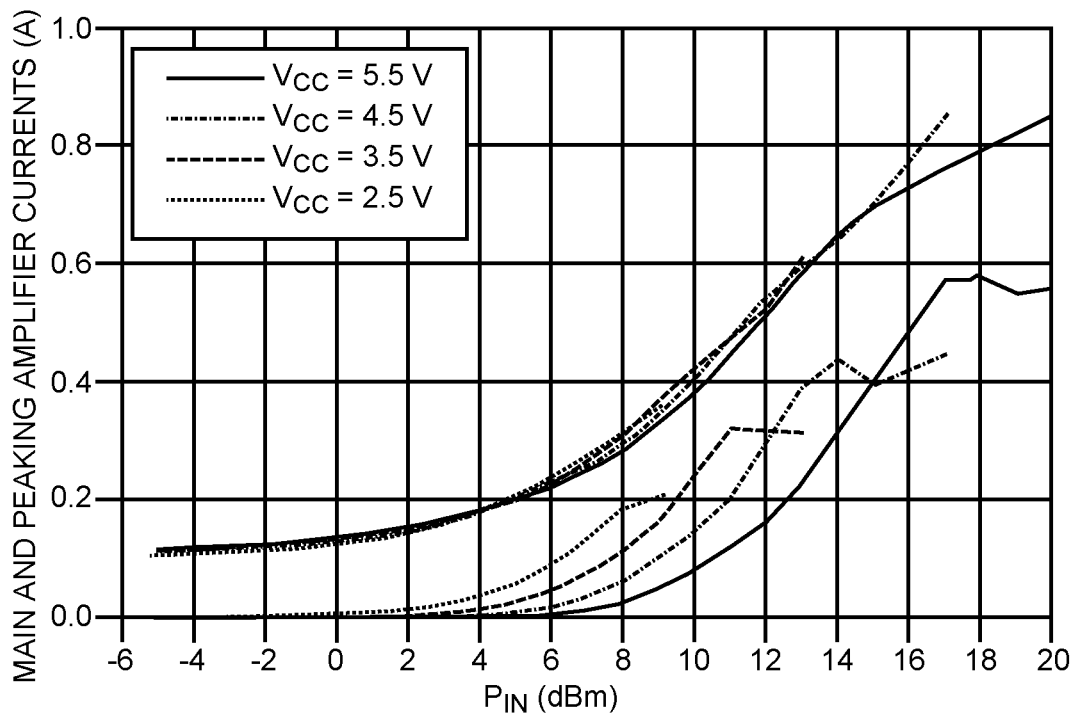
FIG. 14 is an exemplary graph of current associated with various supply voltages versus input power for both the main amplifier and the peaking amplifier.

FIG. 14 is an exemplary graph of current associated with various supply voltages versus input power for both the main amplifier 12 and the peaking amplifier 18. The upper tightly clustered current curves represent current of the main amplifier 12 while the lower more separated current curves represent current of the peaking amplifier 18. Notice that the main amplifier 12 maintains a relatively fixed current trajectory over the various supply voltages, whereas the peaking amplifier 18 is activated at different input power levels for different supply voltages.

Figure 15:
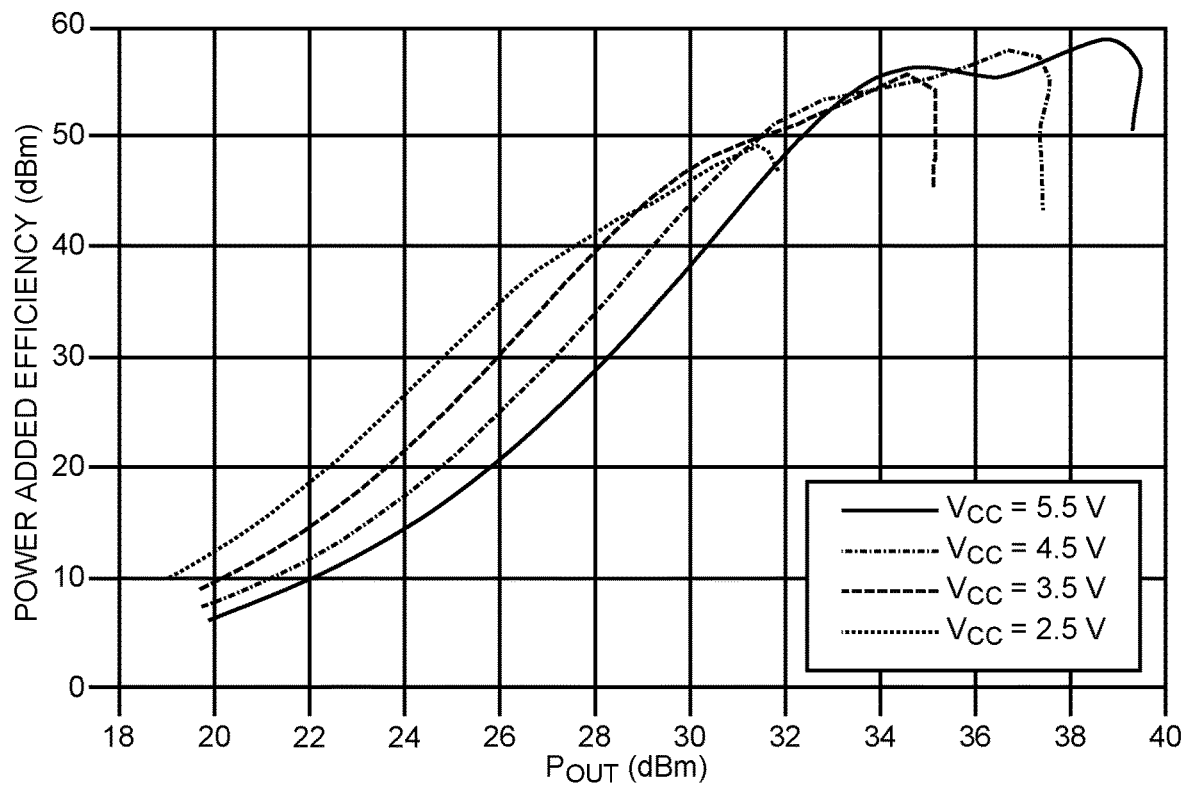
FIG. 15 is an exemplary graph of power added efficiency versus output power for various supply voltages supplying the main amplifier and the peaking amplifier of the Doherty amplifier system 10 embodiments depicted in FIGS. 1-9.

FIG. 15 is an exemplary graph of power added efficiency versus output power for various supply voltages supplying the main amplifier 12 and the peaking amplifier 18 of the Doherty amplifier system 10 embodiments depicted in FIGS. 1-9. Activation of the peaking amplifier 18 under control of the saturation detector 24 occurs as the main amplifier 12 enters saturation caused by the various supply voltages. Although not particularly depicted in the graph of FIG. 16, the Doherty amplifier system 10 is agile and can fully respond to envelope tracking bandwidths greater than 400 MHz. In some embodiments, the Doherty amplifier system 10 can fully respond to envelop tracking bandwidths on the order of 1 GHz.

Figure 16:
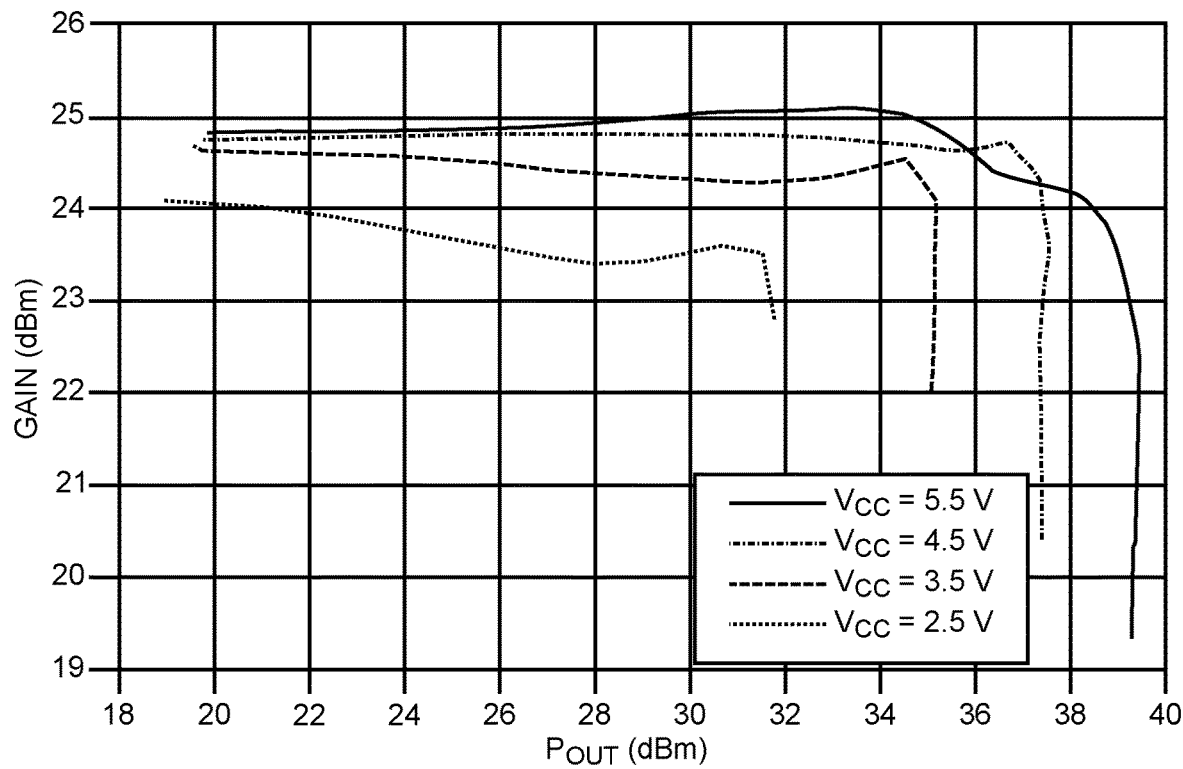
FIG. 16 is an exemplary graph of gain versus output power for various supply voltages supplying the main amplifier and the peaking amplifier of the Doherty amplifier system embodiments depicted in FIGS. 1-9.

FIG. 16 is an exemplary graph of gain versus output power for various supply voltages supplying the main amplifier 12 and the peaking amplifier 18 of the Doherty amplifier system 10 embodiments depicted in FIGS. 1-9. In this exemplary case, the amplitude modulation-amplitude modulation (AM-AM) slope is less than 0.1 dB/dB throughout linear operation of the Doherty amplifier system 10.

Figure 17:
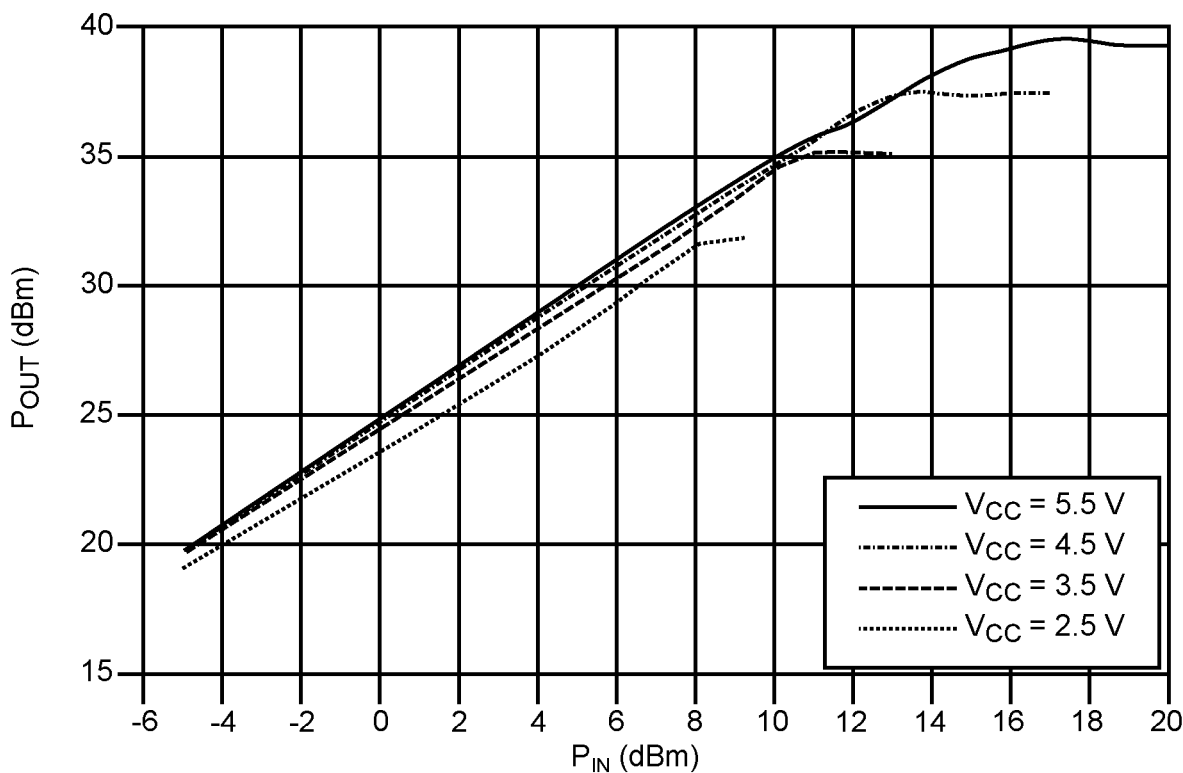
FIG. 17 is an exemplary graph of output power versus input power for various supply voltages supplying the main amplifier and the peaking amplifier of the Doherty amplifier system embodiments depicted in FIGS. 1-9.

FIG. 17 is an exemplary graph of output power versus input power for various supply voltages supplying the main amplifier 12 and the peaking amplifier 18 of the Doherty amplifier system 10 embodiments depicted in FIGS. 1-9. As depicted in FIG. 17, the peaking amplifier 18 provides an increasing amount of power as supply voltage $V_{CC}$ increases between 2.5 V, 3.5 V, 4.5 V, and 5.5 V. Thus, the peaking amplifier 18 reflects impedance on the main amplifier 12 that keeps the main amplifier 12 approximately fixed at a best performance trajectory. Moreover, AM-AM distortion of the Doherty amplifier system 10 remains lower in comparison with a traditional Doherty amplifier without the control of the saturation detector 24.

Figure 18:
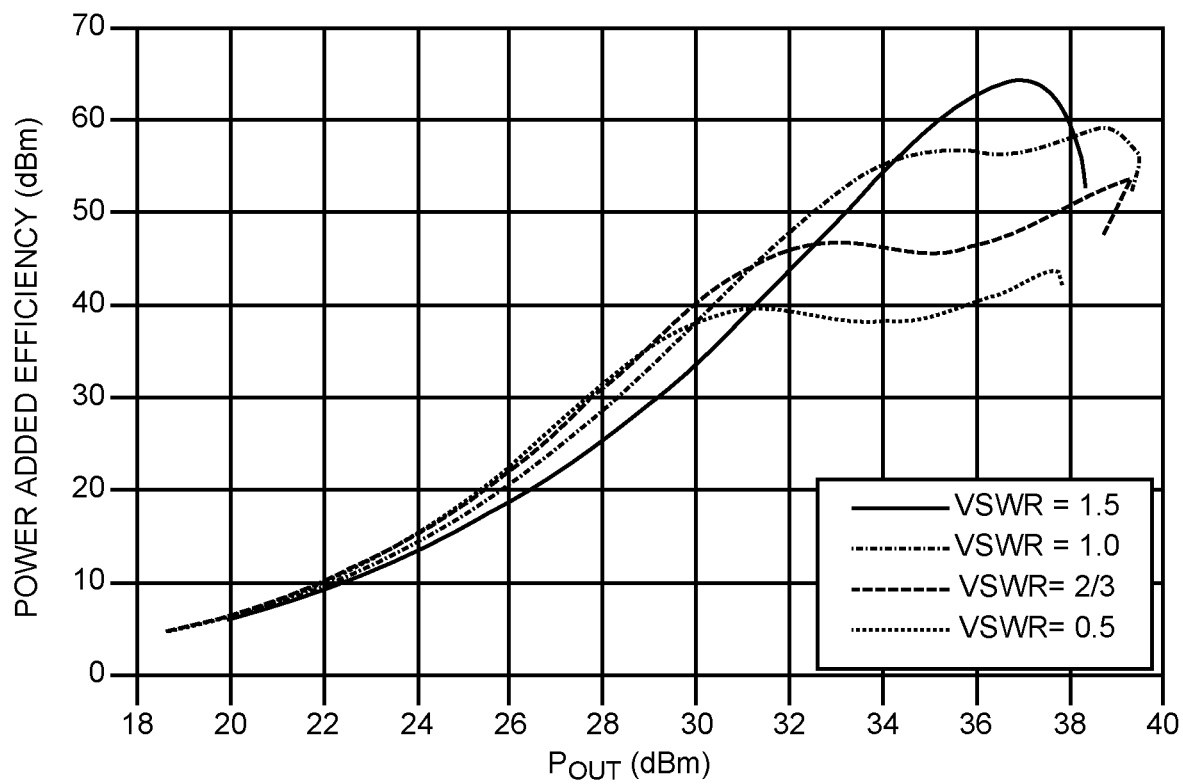
FIG. 18 is an exemplary graph of power added efficiency versus output power for various voltage standing wave ratio (VSWR) conditions at the RF signal output for the Doherty amplifier system embodiments depicted in FIGS. 1-9.

FIG. 18 is an exemplary graph of power added efficiency versus output power for various voltage standing wave ratio (VSWR) conditions at the RF signal output 38 for the Doherty amplifier system 10 embodiments depicted in FIGS. 1-9. Activation of the peaking amplifier 18 under control of the saturation detector 24 occurs as the main amplifier 12 enters saturation caused by the various VSWR conditions. A relatively minor amount of power added efficiency is sacrificed for improved linearity under the various VSWR conditions that in these exemplary cases range from 0.5 to 1.5. Thus, mobile applications benefit particularly from employing embodiments of the Doherty amplifier system 10 due to improved linearity over widely varying VSWR conditions. Further still, the improved linearity afforded by the Doherty amplifier system 10 provides reduced requirements for baseband predistortion techniques, which may result in lower real estate and power dissipation requirements for the transceiver 56 (FIGS. 6 and 7).

Figure 19:
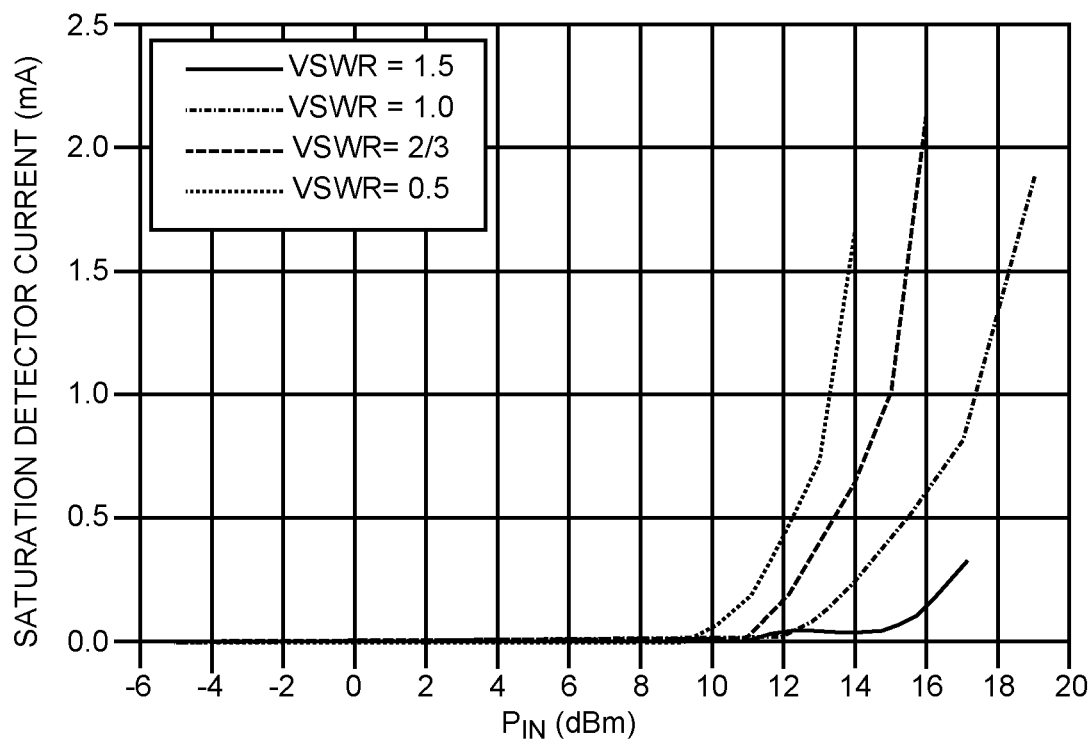
FIG. 19 is an exemplary graph of saturation detector current provided through the detector output versus input power for the Doherty amplifier system for various VSWR conditions at the RF signal output for the embodiments of FIGS. 1-9.

FIG. 19 is a graph of saturation detector current provided through the first detector control output 28 versus input power for the Doherty amplifier system 10 for various VSWR conditions at the RF signal output 38 for the embodiments of FIGS. 1-9. Knees of the saturation detector current occur at points at which the main amplifier 12 (FIGS. 1-9) enters saturation.

Figure 20:
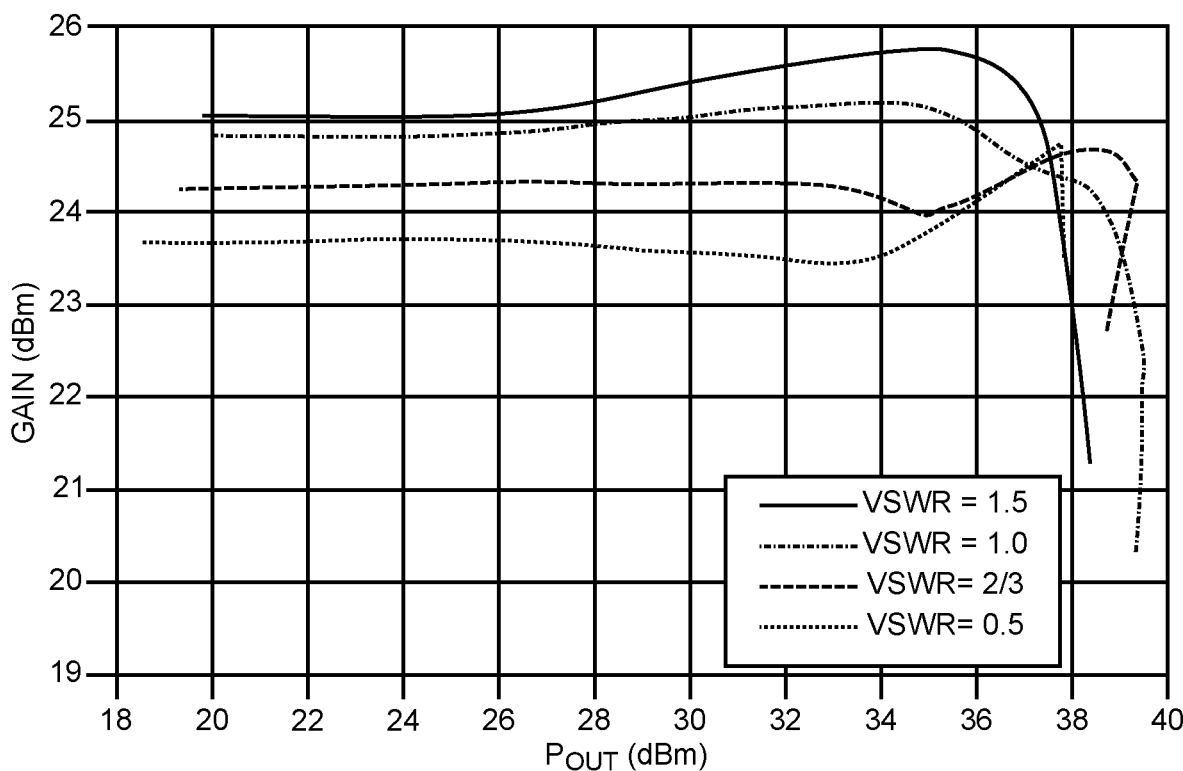
FIG. 20 is an exemplary graph of gain (amplitude modulation-amplitude modulation) versus output power for the Doherty amplifier for various VSWR conditions at the RF signal output for the embodiment of FIG. 5.

FIG. 20 is a graph of gain (AM-AM) versus output power for the Doherty amplifier system 10 for various VSWR conditions at the RF signal output 38 for the embodiment of FIG. 5. Linearization can be improved further by including the digital predistortion provided by the digital predistortion processor 58 depicted in the embodiments of FIG. 6 and FIG. 7.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier system comprising:
a main amplifier configured to receive a first portion of a radio frequency (RF) signal at a main input and provide an amplified copy of the first portion of the RF signal at a main output;
a peaking amplifier configured to be controllably activated to receive a second portion of the RF signal at a peak input and provide an amplified copy of the second portion of the RF signal at a peak output; and
saturation detector comprising a comparator having a detector input coupled to the main output of the main amplifier, a reference input, a first detector control output, and a reference threshold generator coupled to the reference input, wherein the saturation detector is configured to detect saturation of the main amplifier and activate the peaking amplifier as saturation of the main amplifier is detected and deactivate the peaking amplifier when saturation of the main amplifier is not detected by the saturation detector.

2. The Doherty amplifier system of claim 1 wherein the saturation detector is configured to activate and deactivate the peaking amplifier through gain control of the peaking amplifier.

3. The Doherty amplifier system of claim 1 further including a peaking driver amplifier configured to drive the peaking amplifier with the second portion of the RF signal and wherein the saturation detector is configured to activate and deactivate the peaking amplifier through gain control of the peaking driver amplifier.

4. The Doherty amplifier system of claim 1 further including a peaking driver amplifier configured to drive the peaking amplifier with the second portion of the RF signal and wherein the saturation detector is configured to activate and deactivate the peaking amplifier both through gain control of the peaking driver amplifier and gain control of the peaking amplifier.

5. The Doherty amplifier system of claim 1 further including bias circuitry coupled to the peaking amplifier, wherein the bias circuitry is configured to provide a bias point of the peaking amplifier and the saturation detector is configured to activate and deactivate the peaking amplifier through control of the bias point.

6. The Doherty amplifier system of claim 1 further including bias circuitry coupled to the peaking amplifier, wherein the bias circuitry is configured to provide a bias point of the peaking amplifier and the saturation detector is configured to activate and deactivate the peaking amplifier both through control of the bias point and gain control of the peaking amplifier.

7. The Doherty amplifier system of claim 1 further including a supply modulator configured to supply modulated power to at least the peaking amplifier and to provide a supply variation control signal that is summed with a detector control signal output from the saturation detector to activate and deactivate the peaking amplifier.

8. The Doherty amplifier system of claim 1 further including:
bias circuitry coupled to the peaking amplifier and having a bias control input, wherein the bias circuitry is configured to provide a bias point of the peaking amplifier; and
a supply modulator configured to supply modulated power to at least the peaking amplifier and also provide a supply variation control signal that is summed with a detector control signal output from the saturation detector and fed into the bias control input to activate and deactivate the peaking amplifier.

9. The Doherty amplifier system of claim 8 wherein the saturation detector is further configured to provide a second detector control signal that controls gain of the peaking amplifier to activate and deactivate the peaking amplifier.

10. The Doherty amplifier system of claim 8 further including a peaking driver amplifier configured to drive the peaking amplifier with the second portion of the RF signal and wherein the saturation detector is further configured to activate and deactivate the peaking amplifier through gain control of the peaking driver amplifier.

11. The Doherty amplifier system of claim 8 further including a peaking driver amplifier configured to drive the peaking amplifier with the second portion of the RF signal and wherein the saturation detector is further configured to activate and deactivate the peaking amplifier through gain control of both the peaking amplifier and the peaking driver amplifier.

12. The Doherty amplifier system of claim 1 further including a digital predistortion processor configured to provide digital predistortion to the RF signal before the first portion of the RF signal is received at the main input and the second portion of the RF signal is received at the peak input.

13. The Doherty amplifier system of claim 1 wherein the reference threshold generator is configured to generate a reference signal and the comparator is configured to generate a control signal at the first detector control output such that the control signal is proportional to a difference between the amplified copy of the first portion of the RF signal at the main output and the reference signal at the reference input.

14. The Doherty amplifier system of claim 1 wherein the main amplifier is a differential RF power amplifier.

15. The Doherty amplifier system of claim 1 wherein the main amplifier is a single-ended RF power amplifier.

16. A Doherty amplifier system comprising:
 a main amplifier configured to receive a first portion of a radio frequency (RF) signal at a main input and provide an amplified copy of the first portion of the RF signal at a main output;
 a peaking amplifier configured to be controllably activated to receive a second portion of the RF signal at a peak input and provide an amplified copy of the second portion of the RF signal at a peak output; and
 a saturation detector comprising a comparator having a detector input coupled to the main output of the main amplifier, a reference input, a first detector control output, and a reference threshold generator coupled to the reference input, wherein the saturation detector is configured to detect saturation of the main amplifier and activate the peaking amplifier as saturation of the main amplifier is detected and deactivate the peaking amplifier when saturation of the main amplifier is not detected by the saturation detector; and
 a digital predistortion processor configured to provide digital predistortion to the RF signal before the first portion of the RF signal is received at the main input and the second portion of the RF signal is received at the peak input.

17. The Doherty amplifier system of claim 16 wherein the saturation detector is configured to activate and deactivate the peaking amplifier through gain control of the peaking amplifier.

18. The Doherty amplifier system of claim 16 further including a peaking driver amplifier configured to drive the peaking amplifier with the second portion of the RF signal and wherein the saturation detector is configured to activate and deactivate the peaking amplifier through gain control of the peaking driver amplifier.

19. The Doherty amplifier system of claim 16 further including a peaking driver amplifier configured to drive the peaking amplifier with the second portion of the RF signal and wherein the saturation detector is configured to activate and deactivate the peaking amplifier both through gain control of the peaking driver amplifier and gain control of the peaking amplifier.

20. The Doherty amplifier system of claim 16 further including bias circuitry coupled to the peaking amplifier, wherein the bias circuitry is configured to provide a bias point of the peaking amplifier and the saturation detector is configured to activate and deactivate the peaking amplifier through control of the bias point.

* * * * *